(12) United States Patent
Ito

(10) Patent No.: US 12,183,538 B2
(45) Date of Patent: Dec. 31, 2024

(54) SEMICONDUCTOR MANUFACTURING APPARATUS, SEMICONDUCTOR DEVICE AND MANUFACTURING METHOD OF SEMICONDUCTOR DEVICE

(71) Applicant: Kioxia Corporation, Tokyo (JP)

(72) Inventor: Takayuki Ito, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 400 days.

(21) Appl. No.: 17/653,562

(22) Filed: Mar. 4, 2022

(65) Prior Publication Data

US 2023/0069666 A1    Mar. 2, 2023

(30) Foreign Application Priority Data

Aug. 26, 2021    (JP) ................ 2021-138315

(51) Int. Cl.
*H01J 37/05*    (2006.01)
*H01J 37/147*   (2006.01)
(Continued)

(52) U.S. Cl.
CPC .......... *H01J 37/05* (2013.01); *H01J 37/1478* (2013.01); *H01J 37/20* (2013.01); *H01J 37/3023* (2013.01); *H01J 37/3171* (2013.01); *H01L 21/26586* (2013.01); *H01L 29/7836* (2013.01); *H01J 2237/20207* (2013.01); *H01J 2237/20285* (2013.01)

(58) Field of Classification Search
CPC ........ H01J 37/05; H01J 37/1478; H01J 37/20; H01J 37/3023; H01J 37/3171; H01J 2237/20207; H01J 2237/20285; H01J 2237/0041; H01J 2237/05; H01J 2237/20228; H01L 21/26586; H01L 29/7836; H01L 21/26513; H01L 21/26506; H01L 29/0847; H01L 29/6659; H01L 29/7833
USPC .......................................... 250/492-1, 492.3
See application file for complete search history.

(56) References Cited

U.S. PATENT DOCUMENTS 4,935,623 A * 6/1990 Knauer .................... H05H 3/02
                                                          250/281
6,071,781 A    6/2000 Nakajima
(Continued)

FOREIGN PATENT DOCUMENTS

JP           3356629 B2    12/2002
JP         2003-115277 A    4/2003
(Continued)

OTHER PUBLICATIONS

Quirk et al., "Semiconductor Manufacturing Technology", Pearson, Nov. 19, 2000, Ch.9 and 17, 3 pages.

*Primary Examiner* — Michael Maskell
(74) *Attorney, Agent, or Firm* — Oblon, McClelland, Maier & Neustadt, L.L.P.

(57) ABSTRACT

A semiconductor manufacturing apparatus according to the present embodiment includes a stage on which a wafer can be placed. A separator separates a beam of impurities to be introduced into the wafer into an ion component and a neutral component. A controller switches the semiconductor manufacturing apparatus between a first mode and a second mode, where in the first mode, the ion component is introduced into the wafer and in the second mode, the neutral component is introduced into the wafer.

8 Claims, 6 Drawing Sheets

(51) Int. Cl.
*H01J 37/20* (2006.01)
*H01J 37/302* (2006.01)
*H01J 37/317* (2006.01)
*H01L 21/265* (2006.01)
*H01L 29/78* (2006.01)

(56) References Cited

U.S. PATENT DOCUMENTS

| | | | |
|---|---|---|---|
| 7,351,987 | B2 | 4/2008 | Kabasawa et al. |
| 10,825,685 | B2 * | 11/2020 | Kirkpatrick .............. H01J 37/05 |
| 11,698,582 | B2 * | 7/2023 | Khoury ............... A61L 27/3687 |
| | | | 423/446 |
| 2012/0045615 | A1 * | 2/2012 | Kirkpatrick ....... H01L 21/26566 |
| | | | 423/446 |

FOREIGN PATENT DOCUMENTS

| | | | |
|---|---|---|---|
| JP | 4901094 B2 | 3/2012 | |
| JP | 2014-49620 A | 3/2014 | |

\* cited by examiner

SEMICONDUCTOR MANUFACTURING APPARATUS, SEMICONDUCTOR DEVICE AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2021-138315, filed on Aug. 26, 2021, the entire contents of which are incorporated herein by reference.

FIELD

The embodiments of the present invention relate to a semiconductor manufacturing apparatus, a semiconductor device and manufacturing method of semiconductor device.

BACKGROUND

As semiconductor devices are further downscaled, the impurity diffusion layers need to be controlled with higher precision. For example, in a case where a source layer or a drain layer of a transistor is formed of a single impurity diffusion layer, crystal defects are more likely to remain on the impurity diffusion layer, and a leak current increases. In a case where a source layer or a drain layer is formed of a plurality of impurity diffusion layers, it is necessary to repeat a plurality of ion implantation processes in different conditions. This results in a decrease in the throughput.

DETAILED DESCRIPTION

Figure 1:
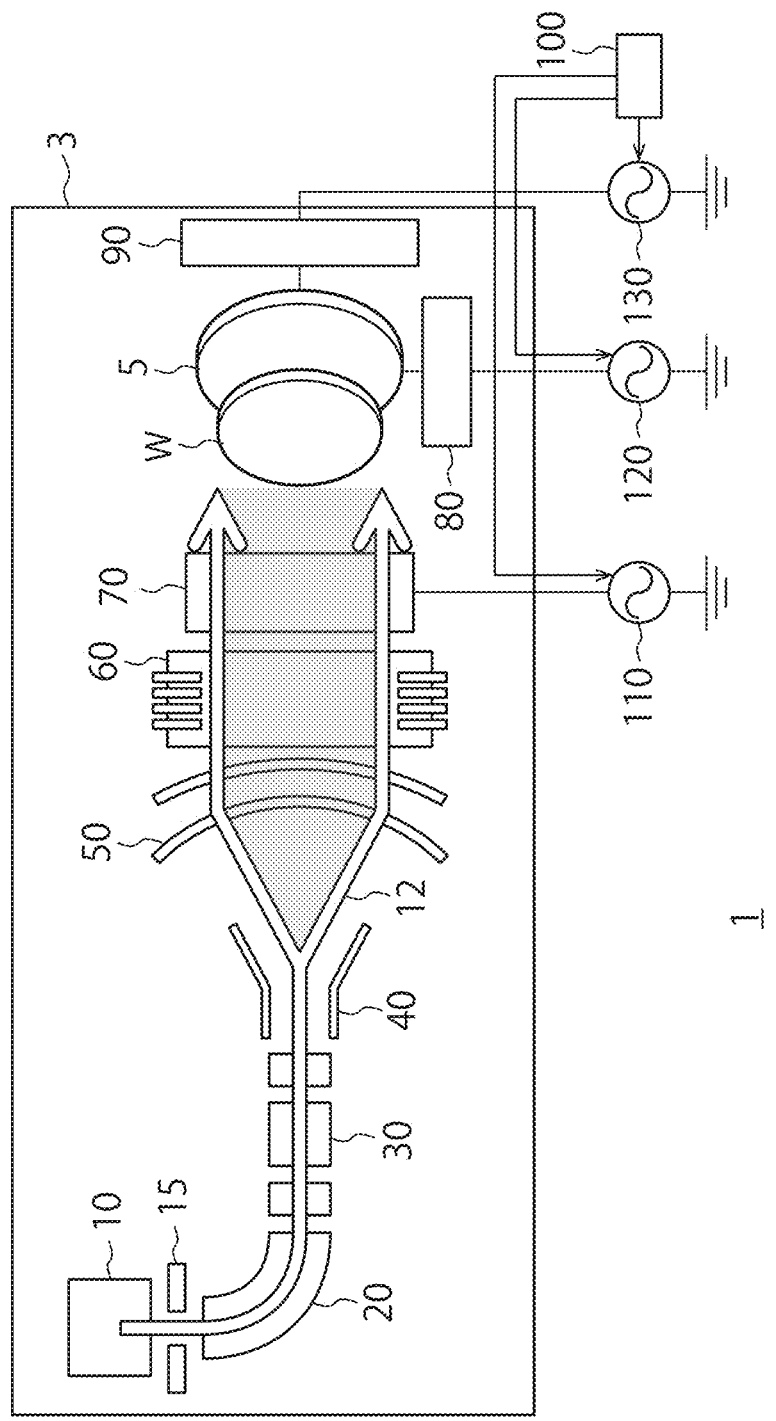
FIG. 1 is a schematic diagram illustrating a configuration example of an ion implantation device according to the present embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor manufacturing apparatus according to the present embodiment includes a stage on which a wafer can be placed. A separator separates a beam of impurities to be introduced into the wafer into an ion component and a neutral component. A controller switches the semiconductor manufacturing apparatus between a first mode and a second mode, where in the first mode, the ion component is introduced into the wafer and in the second mode, the neutral component is introduced into the wafer.

FIG. 1 is a schematic diagram illustrating a configuration example of an ion implantation device 1 according to the present embodiment. The ion implantation device 1 includes a chamber 3, a stage 5, an ion source 10, an analyzer 20, a Q lens 30, a scanner 40, a parallel lens 50, an acceleration-deceleration electrode 60, and an energy filter 70. The ion implantation device 1 is a device to dope impurities into a semiconductor wafer W. The ion implantation device 1 implants the impurities of, for example, boron (B), phosphorus (P), or arsenic (As). In the present embodiment, the ion implantation device 1 is described below as implanting boron into the semiconductor wafer W as an example.

The chamber 3 accommodates therein the stage 5, the ion source 10, the analyzer 20, the Q lens 30, the scanner 40, the parallel lens 50, the acceleration-deceleration electrode 60, and the energy filter 70. The chamber 3 is connected to a vacuum pump (not illustrated), and is configured to be capable of reducing the internal pressure of the chamber 3. The chamber 3 is provided with a carrier opening for the semiconductor wafer W. The semiconductor wafer W is carried into the chamber 3 from the carrier opening, and is placed on the stage 5. Also, the semiconductor wafer W is carried out of the chamber 3 through the carrier opening.

On the stage 5, the semiconductor wafer W can be placed. The stage 5 is configured to move the location of the semiconductor wafer W, or to be capable of changing the inclination angle of the semiconductor wafer W relative to an ion beam 12. Drivers 80 and 90 are connected to the stage 5. The driver 80 is configured to be capable of moving the stage 5 in a direction almost parallel to the installation plane of the stage 5. The driver 90 is configured to be capable of inclining the installation plane of the stage 5 relative to an incident angle of the ion beam 12. Due to these configurations, the stage 5 can move the semiconductor wafer W within the chamber 3, and adjust the angle of the semiconductor wafer W relative to the ion beam 12.

The ion source 10 is, for example, an ion source of an impurity $BF_3$.

An aperture 15 is an opening portion to shape impurity beams from the ion source 10.

The analyzer 20 removes undesired ions contained in the impurity beams, and extracts a desired ion beam 12. For example, in order to extract the ion beam 12 of B+ ions from the impurity beams (B+, F+, BF+, and $BF_2$+) generated from the ion source of $BF_3$, the analyzer 20 removes the other ions that are the F+ ions, BF+ ions, and $BF_2$+ ions.

The Q lens 30 is an electromagnetic lens to electromagnetically shape the desired ion beam (for example, B+ ions) 12 extracted by the analyzer 20.

The scanner 40 controls the direction of the ion beam 12 to scan the B+ ions on the semiconductor wafer W.

The parallel lens 50 is an electromagnetic lens to focus or disperse the ion beam 12.

The acceleration-deceleration electrode 60 accelerates or decelerates the ion beam 12.

The ion beam 12 having passed through such a beam line (15, 20, 30, 40, 50, and 60) as illustrated in FIG. 1 may be neutralized by gas remaining in the chamber 3. Therefore, the ion beam 12 includes not only an ion beam (an ion component), but also a neutral beam (a neutral component) having been neutralized. Hereinafter, a component of the ion beam 12, remaining as an ion, is referred to as "ion component", while a component of the ion beam 12, resulting from neutralization of the ion, is referred to as "neutral component".

The energy filter 70 controls the ion component of the ion beam 12 to separate the ion component from the neutral component. At this time, the energy filter 70 applies the ion component with acceleration energy or deceleration energy to cause a difference in implantation energy between the ion component and the neutral component. Due to this operation, the energy filter 70 can introduce the ion component and the neutral component separately into the semiconductor wafer W. Moreover, the energy filter 70 can introduce the ion component into the semiconductor wafer W at a first depth by using a specific amount of energy, and can introduce the neutral component into the semiconductor wafer W at a second depth by using a different amount of energy. For example, the energy filter 70 can decelerate the boron ions (B+) and implant the decelerated boron ions (B+) in the semiconductor wafer W by using relatively low energy, while implanting the neutralized boron (B) without being accelerated or decelerated in the semiconductor wafer W by using relatively high energy. Due to this implantation, a boron diffusion layer having been introduced to a deep location, and a boron diffusion layer having been introduced only to a relatively shallow location can be formed on the semiconductor wafer W. That is, a plurality of impurity layers can be formed on the semiconductor wafer W at different depths. At this time, the stage 5 moves to change the location and inclination of the semiconductor wafer W, and thereby a deep boron diffusion layer and a shallow boron diffusion layer can be formed on the semiconductor wafer W at the same location in plan view when these layers are viewed from the top of the surface of the semiconductor wafer W.

A controller 100 controls each constituent element of the ion implantation device 1 and power supplies 110 to 130. The power supply 110 supplies power to the energy filter 70 in order to control the ion component of the ion beam 12. The power supply 120 supplies power to the driver 80 such that the stage 5 can be moved. The power supply 130 supplies power to the driver 90 such that the inclination angle of the stage 5 can be changed. The controller 100 controls the operation of other constituent elements of the ion implantation device 1.

Next, an ion implantation method using the ion implantation device 1 is described.

Figure 2A:
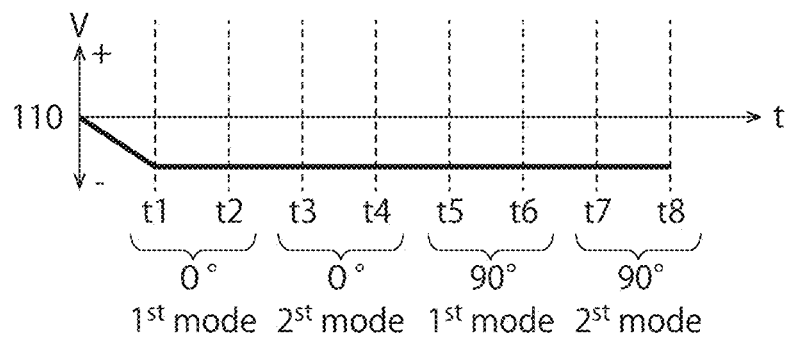
FIGS. 2A to 2C are graphs illustrating an example of the voltage of the power supplies in the ion implantation method according to the present embodiment.
Figure 2B:
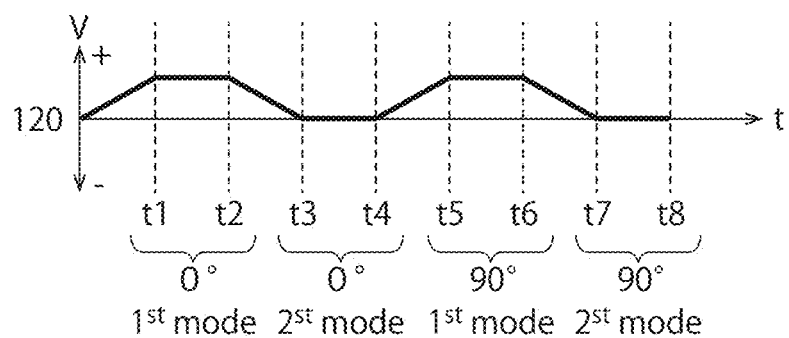
Figure 2C:
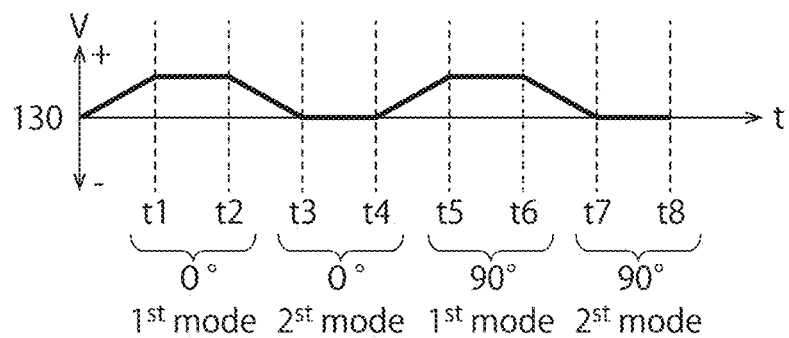
Figure 3:
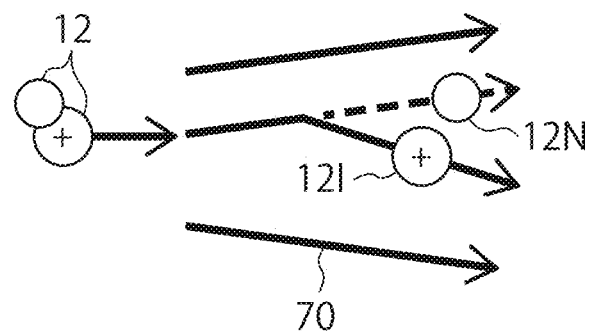
FIG. 3 is a conceptual diagram illustrating an ion component and a neutral component in the energy filter.
Figure 4:
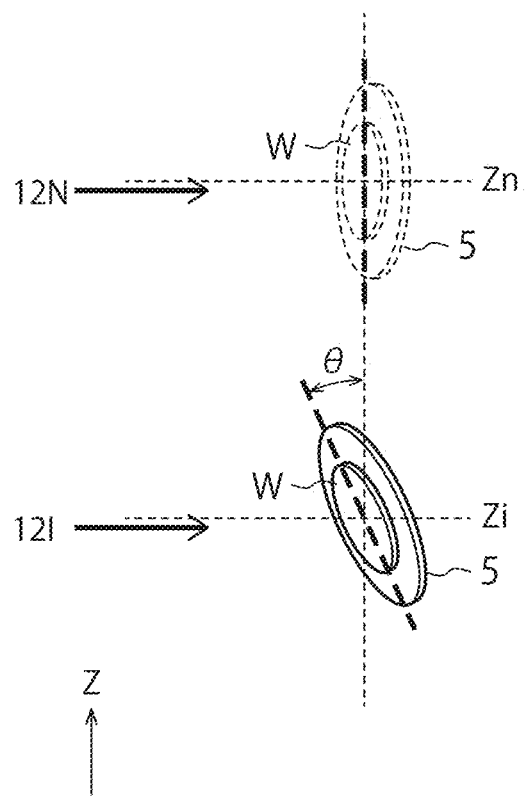
FIG. 4 is a conceptual diagram illustrating an operation of the stage.

FIGS. 2A to 2C are graphs illustrating an example of the voltage of the power supplies 110 to 130 in the ion implantation method according to the present embodiment. The vertical axis represents the power-supply voltage of each of the power supplies 110 to 130. The horizontal axis represents a time t. FIG. 3 is a conceptual diagram illustrating an ion component 12I and a neutral component 12N in the energy filter 70. FIG. 4 is a conceptual diagram illustrating an operation of the stage 5.

First, the ion source 10 in FIG. 1 generates, for example, ions of impurities $BF_3$ to generate an impurity beam. The aperture 15 shapes and accelerates the impurity beam. The analyzer 20 removes undesired ions (for example, F+, BF+, and $BF_2$+) contained in the impurity beam, and extracts the desired ion beam 12 (for example, B+).

Next, the Q lens 30 electromagnetically shapes the ion beam 12, and the scanner 40 controls the direction of this shaped ion beam 12.

Subsequently, the parallel lens 50 focuses or disperses the ion beam 12, and then the acceleration-deceleration electrode 60 accelerates or decelerates the ion beam 12.

The ion beam 12 having passed through such a beam line (15, 20, 30, 40, 50, and 60) as illustrated in FIG. 1 may be neutralized by gas remaining in the chamber 3. Therefore, the ion beam 12 not only includes an ion component, but also includes a neutral component.

In view of the above, as illustrated in FIG. 2A, the power supply 110 applies a negative voltage to the energy filter 70 at and after t1. Due to this operation, the energy filter 70 can extract the ion component from the ion beam 12, and separate the ion component from the neutral component.

For example, as illustrated in FIG. 3, the traveling direction of boron ions (B+) serving as an ion component is bent by the electric field from the energy filter 70. In contrast, the traveling direction of boron particles (B) serving as a neutral component remains almost unchanged regardless of the electric field from the energy filter 70. Due to these traveling directions, the energy filter 70 separates the ion component 12I and the neutral component 12N from each other.

As illustrated in FIG. 2B, during the period from t1 to t2, the power supply 120 applies a positive voltage to the driver 80, while the power supply 130 applies a positive voltage to the driver 90 as illustrated in FIG. 2C. Due to this operation, as illustrated in FIG. 4, the driver 80 moves the stage 5 in the −Z direction to position the semiconductor wafer W at a location Zi such that the semiconductor wafer W is irradiated with the ion component 12I. The driver 90 also inclines the stage 5 at an angle θ such that the ion component 12I is introduced from a direction inclined at the angle θ relative to a direction perpendicular to the surface of the semiconductor wafer W. The angle θ is an inclination angle of the stage 5 with respect to the plane nearly perpendicular to the traveling direction of the ion component 12I.

At this time, the scanner 40 controls the direction of the ion beam 12 to scan the beams of the ion component 12I and the neutral component 12N over the semiconductor wafer W in its entirety. The process of implanting the ion component 12I into the semiconductor wafer W at the location Zi is herein referred to as "first mode".

Next, as illustrated in FIG. 2B, during the period from t3 to t4, the power supply 120 stops supply of a positive voltage, while the power supply 130 stops supply of a positive voltage as illustrated in FIG. 2C. Due to this operation, as illustrated in FIG. 4, the driver 80 moves the stage 5 back to the +Z direction to position the semiconductor wafer W at a location Zn such that the semiconductor wafer W is irradiated with the neutral component 12N. The driver 90 brings the stage 5 from the inclined orientation back to the original orientation in such a manner that the neutral component 12N is incident from a direction nearly perpendicular to the surface of the semiconductor wafer W. The driver 90 inclines the stage 5 in such a manner that the neutral component 12N is incident from the direction nearly perpendicular to the surface of the semiconductor wafer W. The driver 90 may incline the stage 5 at an angle φ (not illustrated) different from the angle θ in such a manner that the neutral component 12N is introduced from a direction inclined at the angle φ relative to the direction perpendicular to the surface of the semiconductor wafer W. The angle φ is an inclination angle of the stage 5 with respect to the plane nearly perpendicular to the traveling direction of the neutral component 12N. The process of implanting the neutral component 12N into the semiconductor wafer W at the location Zn is herein referred to as "second mode".

At this time, the scanner 40 controls the direction of the ion beam 12 to scan the beams of the ion component 12I and the neutral component 12N over the semiconductor wafer W in its entirety.

The controller 100 switches the ion implantation device 1 between the first mode and the second mode during the period from t2 to t3, the period from t4 to t5, and the period from t6 to t7. Due to this switching, the driver 80 can move the stage 5 between the location Zi at which the ion component 12I is introduced in the first mode, and the location Zn at which the neutral component 12N is introduced in the second mode. The driver 90 can adjust the inclination of the stage 5 in the first mode and the second mode. The drivers 80 and 90 move the stage 5 between the location Zi and the location Zn in synchronization with adjustment of the stage 5 between the inclination angle $\theta$ of the stage 5 at the location Zi and the inclination angle $\varphi$ of the stage 5 at the location Zn.

The first mode and the second mode are carried out sequentially in the same chamber 3. Therefore, a plurality of impurity layers of different concentrations can be formed at different depths.

During the transition period between the first mode and the second mode (for example, the period from t2 to t3 and the period from t4 to t5), the ion implantation device 1 may continuously irradiate the ion beam 12 toward the stage 5. Alternatively, the ion implantation device 1 may also discontinue irradiation of the ion beam 12 once after the first mode ends, and may restart the irradiation when the second mode starts. The first mode and the second mode are not limited to being carried out in a particular order. Either the first mode or the second mode may be carried out before the other.

Next, the stage 5 rotates the semiconductor wafer W by, for example, 90 degrees, and then the operation of t1 to t4 is performed during the period from t5 to t8. Thereafter, the semiconductor wafer W is further rotated by 180 degrees and by 270 degrees to repeat the operation of t1 to t4. This causes the ion component 12I and the neutral component 12N to be introduced over the entire surface of the semiconductor wafer W.

Acceleration energy (keV) of the ion component 12I and the neutral component 12N is now described.

Figure 5:
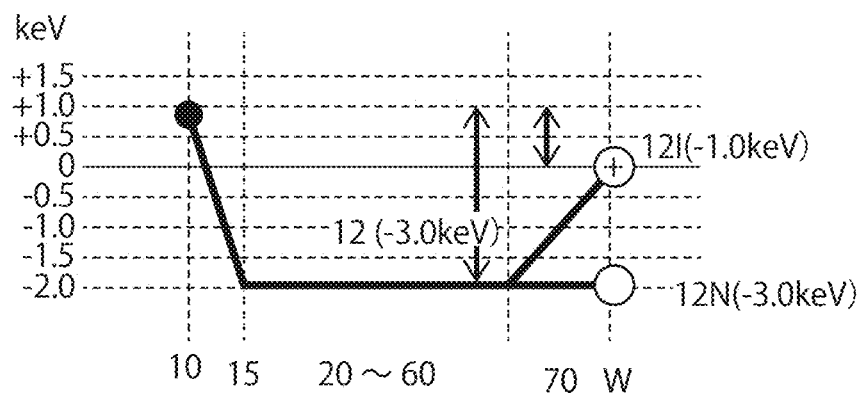
FIG. 5 is a graph illustrating an example of the acceleration energy of the ion component and the neutral component.

FIG. 5 is a graph illustrating an example of the acceleration energy of the ion component 12I and the neutral component 12N. The vertical axis represents the acceleration energy (keV). The horizontal axis represents the location of the ion beam 12, the ion component 12I, or the neutral component 12N.

In the present embodiment, the ion source 10 is applied with an acceleration energy of, for example, about +1.0 keV. The ion beam 12 is extracted from the ion source 10, and is accelerated through the aperture 15 by an acceleration energy of, for example, about −2.0 keV. Therefore, the acceleration energy of the ion beam 12 is a difference in potential between the ion source 10 and the aperture 15, that is for example, about −3.0 keV.

When the ion beam 12 passes through the beam line (20 to 60), gas in the chamber 3 brings the ion beam 12 into a state of mixture of the ion component 12I and the neutral component 12N.

Next, the energy filter 70 separates the ion beam 12 into the ion component 12I and the neutral component 12N. At this time, the energy filter 70 is supplied with power from the power supply 110 to apply an electric field to the ion beam 12 to change the travelling direction of only the ion component 12I. Since the neutral component 12N is electrically neutral, the neutral component 12N is not affected by the electric field. Consequently, the travelling direction of the neutral component 12N remains unchanged.

The energy filter 70 causes a difference in the acceleration energy between the ion component 12I and the neutral component 12N. For example, the energy filter 70 decreases the acceleration energy of the ion component 12I by about −2.0 keV. Consequently, the acceleration energy of the ion component 12I is about −1.0 keV with reference to the potential of the ion source 10. In contrast, since the neutral component 12N is electrically neutral, the neutral component 12 is not affected by the electric field from the energy filter 70. Consequently, the acceleration energy of the neutral component 12N is maintained at, for example, about −3.0 keV.

In this manner, the energy filter 70 separates the ion beam 12 into the ion component 12I and the neutral component 12N, and causes a difference in the acceleration energy between the ion component 12I and the neutral component 12N. The ion component 12I thus travels to the lower location Zi in FIG. 4 by using an acceleration energy of about −1.0 keV. The neutral component 12N thus travels to the upper location Zn in FIG. 4 by using an acceleration energy of about −3.0 keV.

(First Mode)

In the first mode, the stage 5 positions the semiconductor wafer W at the location Zi, and the stage 5 is inclined at the angle $\varphi$. The ion component 12I is introduced from a direction inclined at the angle $\varphi$ relative to the direction nearly perpendicular to the surface of the semiconductor wafer W. The acceleration energy of the ion component 12I is, for example, about −1 keV.

(Second Mode)

In the second mode, the stage 5 positions the semiconductor wafer W at the location Zn, and the stage 5 is inclined at the angle $\varphi$. The neutral component 12N is introduced from a direction inclined at the angle $\varphi$ relative to the direction nearly perpendicular to the surface of the semiconductor wafer W. In the present embodiment, the angle $\varphi$ is almost 0 degree. Therefore, the neutral component 12N is introduced from a direction nearly perpendicular to the surface of the semiconductor wafer W. The acceleration energy of the neutral component 12N is, for example, about −3 keV.

Figure 6:
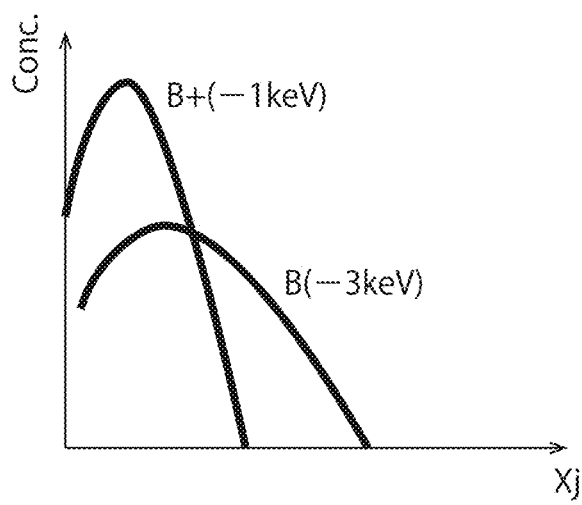
FIG. 6 is a graph illustrating the impurity concentration and depth of the diffusion layers formed in the first mode and the second mode.

FIG. 6 is a graph illustrating the impurity concentration and depth of the diffusion layers formed in the first mode and the second mode. The vertical axis represents the concentration of impurities (for example, boron). The horizontal axis represents the depth from the surface of the semiconductor wafer W. In the first mode, the acceleration energy of the ion component 12I is, for example, about −1 keV. Therefore, the ion component 12I (for example, B+) is introduced to a relatively shallow location from the surface of the semiconductor wafer W. In contrast, in the second mode, the acceleration energy for the neutral component 12N is, for example, about −3 keV. Therefore, the neutral component 12N (for example, B) is introduced to a relatively deep location from the surface of the semiconductor wafer W.

The concentrations of the ion component 12I and the neutral component 12N of the ion beam 12 vary in response to the pressure in the chamber 3. For example, in a case where the pressure in the chamber 3 is very low and the chamber 3 is nearly in vacuum, the ion beam 12 hardly collides with other gas in the chamber 3. The ion beam 12 is neutralized into the neutral component 12N by colliding with other gas. Thus, when the pressure in the chamber 3 is very low, the majority portion of the ion beam 12 remains as the ion component 12I, and hardly changes to the neutral component 12N. In this case, the concentration of the ion component 12I becomes relatively high, while the concentration of the neutral component 12N becomes relatively low.

In contrast, when the pressure in the chamber 3 is relatively high, the majority portion of the ion beam 12 collides with other gas in the chamber 3. In this case, the majority portion of the ion beam 12 is neutralized into the neutral component 12N. Therefore, the concentration of the neutral component 12N becomes relatively high, while the concentration of the ion component 12I becomes relatively low.

The controller 100 may control the concentrations of the ion component 12I and the neutral component 12N by controlling the pressure in the chamber 3. Due to this control, the ion implantation device 1 according to the present embodiment can control each of the impurity layers introduced in the first mode and the second mode to its desired concentration.

As described above, the ion implantation device 1 according to the present embodiment switches between the first mode and the second mode sequentially in the same ion implantation process. In the first mode, the ion implantation device 1 introduces the ion component 12I into the semiconductor wafer W. In the second mode, the ion implantation device 1 introduces the neutral component 12N into the semiconductor wafer W. In the first mode and the second mode, the ion component 12I and the neutral component 12N having different amounts of acceleration energy from each other can be implanted into the semiconductor wafer W even in the same ion-implantation condition. The energy filter 70 separates the ion component 12I and the neutral component 12N from each other, and implants the ion component 12I and the neutral component 12N into the semiconductor wafer W by using different amounts of acceleration energy from each other. The stage 5 moves the semiconductor wafer W to change the inclination angle of the semiconductor wafer W from the plane perpendicular to the traveling direction of the ion component 12I and the neutral component 12N. Due to this operation, diffusion layers formed of a plurality of impurity layers with different concentrations can be formed on the semiconductor wafer W at different depths in a one-time ion implantation process.

Figure 7:
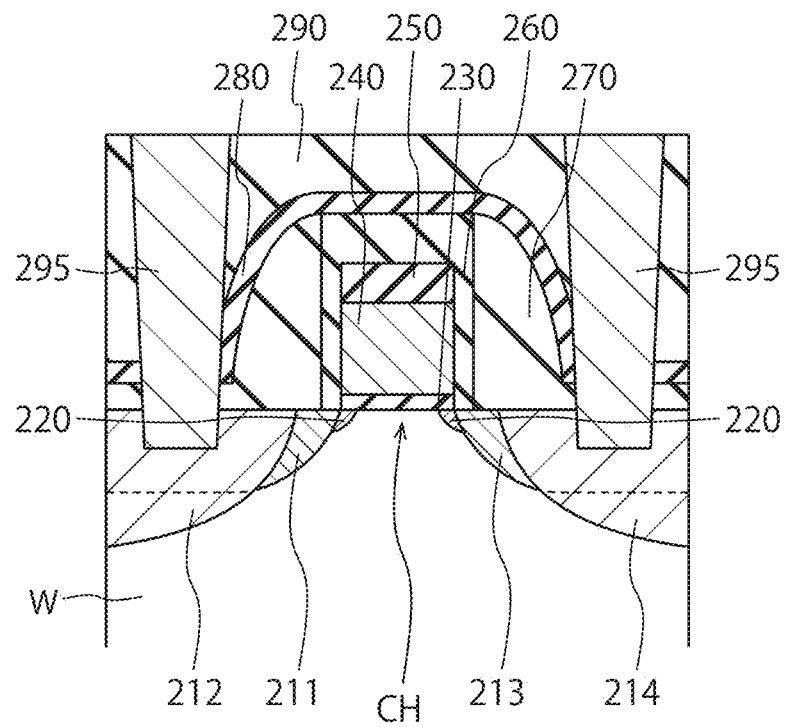
FIG. 7 is a cross-sectional diagram illustrating a configuration example of a transistor according to the present embodiment.

FIG. 7 is a cross-sectional diagram illustrating a configuration example of a transistor Tr according to the present embodiment. The transistor Tr may be, for example, a transistor in a CMOS (Complementary Metal Oxide Semiconductor) circuit used in a controller of a NAND flash memory. The transistor Tr is formed on the semiconductor wafer W.

The transistor Tr includes the semiconductor wafer W, source diffusion layers 211 and 212, drain diffusion layers 213 and 214, a gate dielectric film 230, a gate electrode 240, a cap film 250, a protective film 260, spacers 270, a liner layer 280, an interlayer dielectric film 290, and contacts 295. Hereinafter, while the transistor Tr is described as being a P-type MOSFET (MOS Field Effect Transistor), the transistor Tr may be an N-type MOSFET.

The semiconductor wafer W is, for example, a silicon substrate. The gate electrode 240 is provided on the surface of the semiconductor wafer W through the gate dielectric film 230. For example, a conductive material such as doped polysilicon or metal is used for the gate electrode 240. For example, a silicon oxide film or a high dielectric material of higher relative dielectric constant than that of the silicon oxide film is used for the gate dielectric film 230.

The source diffusion layers 211 and 212 are provided on one side of the gate electrode 240. The source diffusion layers 211 and 212 include a plurality of impurity layers 211 and 212 at different depths. The impurity layer 211 is made of the ion component 12I implanted in the first mode. The impurity layer 212 is made of the neutral component 12N implanted in the second mode. Therefore, the impurity layer 212 is formed more deeply than the impurity layer 211. The impurity layers 211 and 212 may be formed by implanting, for example, boron.

The impurity layer 211 is formed by implanting the ion component 12I from the direction inclined to the surface of the semiconductor wafer W. In contrast, the impurity layer 212 is formed by implanting the neutral component 12N from the direction perpendicular to the surface of the semiconductor wafer W. Thus, the impurity layer 211 extends from the impurity layer 212 toward a channel area CH below the gate electrode 240, and is provided closer to the channel area CH than the impurity layer 212.

The drain diffusion layers 213 and 214 are provided on the other side of the gate electrode 240. The drain diffusion layers 213 and 214 include a plurality of impurity layers 213 and 214 at different depths. The impurity layer 213 is made of the ion component 12I implanted in the first mode, and is formed simultaneously with or sequentially from the impurity layer 211. The impurity layer 214 is made of the neutral component 12N implanted in the second mode, and is formed simultaneously with or sequentially from the impurity layer 212. Therefore, the impurity layer 214 is formed more deeply than the impurity layer 213. The impurity layers 213 and 214 may be formed by implanting, for example, boron.

The impurity layer 213 is formed by implanting the ion component 12I from the direction inclined to the surface of the semiconductor wafer W. In contrast, the impurity layer 214 is formed by implanting the neutral component 12N from the direction perpendicular to the surface of the semiconductor wafer W. Thus, the impurity layer 213 extends from the impurity layer 214 toward the channel area CH below the gate electrode 240, and is provided closer to the channel area CH than the impurity layer 214.

The source diffusion layers 211 and 212 and the drain diffusion layers 213 and 214 may additionally be provided with LDDs (Lightly Doped Drains) 220 further closer to the channel area CH. In the present embodiment, the source diffusion layers are formed of two impurity layers, while the drain diffusion layers are formed of two impurity layers. The source diffusion layers may also be formed of three or more impurity layers, while the drain diffusion layers may also be formed of three or more impurity layers.

The cap film 250 is provided on the top of the gate electrode 240. The cap film 250 is used as a hard mask for forming the gate electrode 240. An insulating material such as a silicon nitride film is used for the cap film 250.

The protective film 260 is provided so as to cover the gate electrode 240 and the cap film 250. An insulating material such as a silicon oxide film is used for the protective film 260.

The spacers 270 are provided on opposite sides of the gate electrode 240 through the protective film 260. An insulating material such as a silicon oxide film is used for the spacers 270.

The liner layer 280 is provided so as to cover the spacers 270 and the protective film 260 from above. An insulating material such as a silicon nitride film is used for the liner layer 280. The liner layer 280 prevents entry of harmful substances such as hydrogen from the outside.

The interlayer dielectric film 290 is provided on the top of the liner layer 280. An insulating material such as a silicon oxide film is used for the interlayer dielectric film 290.

Each of the contacts 295 penetrates the interlayer dielectric film 290, the liner layer 280, and the like, and is connected to the source diffusion layers 211 and 212 or the drain diffusion layers 213 and 214. Low-resistance metal such as tungsten or copper is used as a material of the contacts 295.

With this structure, the transistor Tr electrically connects or disconnects the source diffusion layers 211 and 212 to or from the drain diffusion layers 213 and 214 through the channel area CH in response to the potential of the gate electrode 240.

Figure 8:
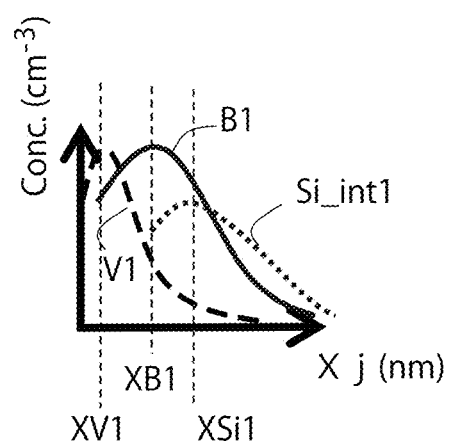
FIG. 8 is a graph illustrating the concentrations of boron, interstitial silicon, and a vacancy which are generated on the semiconductor wafer by implanting the ion component in the first mode.
Figure 9:
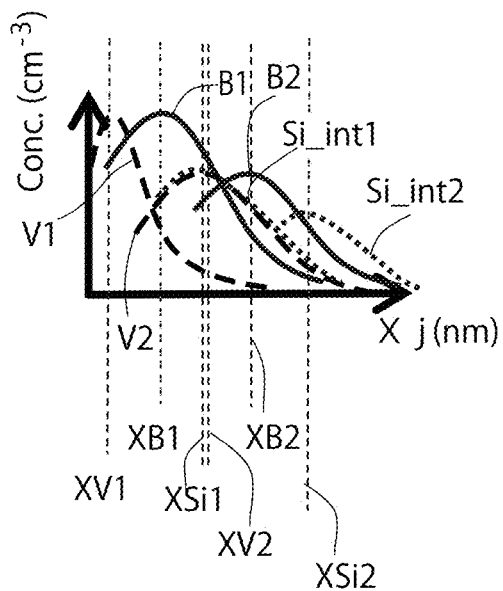
FIG. 9 is a graph illustrating the concentrations of the boron, the interstitial silicon and a vacancy which are generated on the semiconductor wafer by implanting the ion component in the first mode and implanting the neutral component in the second mode.
Figure 10:
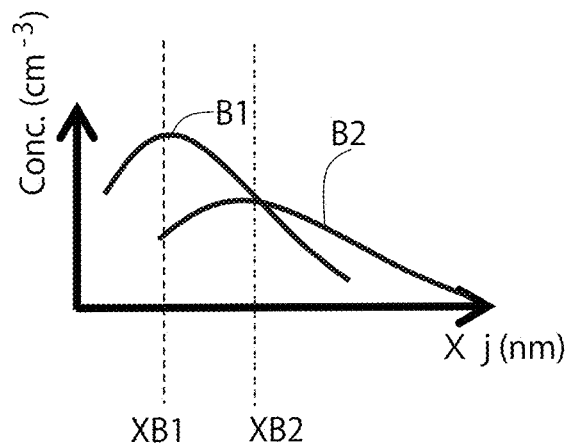
FIG. 10 is a graph illustrating the concentrations of the boron in the semiconductor wafer after the ion implantation device carries out the first and second modes, and performs annealing treatment.

FIG. 8 is a graph illustrating the concentrations of boron B1, interstitial silicon Si_int1, and a vacancy V1 which are generated on the semiconductor wafer W by implanting the ion component 12I in the first mode. FIG. 9 is a graph illustrating the concentrations of the boron B1, boron B2, the interstitial silicon Si_int1, interstitial silicon Si_int2, the vacancy V1, and a vacancy V2 which are generated on the semiconductor wafer W by implanting the ion component 12I in the first mode and implanting the neutral component 12N in the second mode. FIG. 10 is a graph illustrating the concentrations of the boron B1 and the boron B2 in the semiconductor wafer W after the ion implantation device 1 carries out the first and second modes, and performs annealing treatment. The vertical axis in these graphs represents the concentration, while the horizontal axis represents a depth Xj from the surface of the semiconductor wafer W.

As illustrated in FIG. 8, in the first mode in which the ion component 12I is implanted, the boron B1 is implanted at a depth location XB1 from the surface of the semiconductor wafer W. At this time, the vacancy V1 and the interstitial silicon Si_int1 appear due to the influence of implantation of the ion component 12I. The interstitial silicon Si_int1 is a silicon atom disconnected from the crystal bonding when the boron B1 collides with a silicon crystal of the semiconductor wafer W. The vacancy V1 is an empty space remaining after the silicon atom has been disconnected from the crystal bonding. The vacancy V1 appears at a depth location XV1 from the surface of the semiconductor wafer W. The interstitial silicon Si_int1 appears at a depth location XSi1 from the surface of the semiconductor wafer W.

Since the vacancy V1 and the interstitial silicon Si_int1 appear when the boron B1 collides with a silicon crystal, XV1<XB1<XSi1 is satisfied. Since the vacancy V1 is a crystal defect, it is more preferable to have less vacancy. At the depth locations XB1, XV1, and XSi1, the points of the concentration peak of the boron B1, the vacancy V1, and the interstitial silicon Si_int1 are shown, respectively.

As illustrated in FIG. 9, in the second mode in which the neutral component 12N is implanted, the boron B2 is implanted at a depth location XB2 from the surface of the semiconductor wafer W. At this time, the vacancy V2 and the interstitial silicon Si_int2 appear due to the influence of implantation of the neutral component 12N. The interstitial silicon Si_int2 is a silicon atom disconnected from the crystal bonding when the boron B2 collides with a silicon crystal of the semiconductor wafer W. The vacancy V2 is an empty space remaining after the silicon atom has been disconnected from the crystal bonding. For example, the vacancy V2 appears at a depth location XV2 from the surface of the semiconductor wafer W. The interstitial silicon Si_int2 appears at a depth location XSi2 from the surface of the semiconductor wafer W.

Since the vacancy V2 and the interstitial silicon Si_int2 appear when the boron B2 collides with a silicon crystal, XV2<XB2<XSi2 is satisfied. Since the vacancy V2 is a crystal defect, it is more preferable to have less vacancy. At the depth locations XB2, XV2, and XSi2, the points of the concentration peak of the boron B2, the vacancy V2, and the interstitial silicon Si_int2 are shown, respectively.

The depth location XV2 of the vacancy V2 is close to, or almost the same as, the depth location XSi1 of the interstitial silicon Si_int1. Due to this location, after the annealing treatment, the interstitial silicon Si_int1 is relocated in the vacancy V2, and thus the concentrations of the vacancy V2 and the interstitial silicon Si_int1 can be decreased. With this decrease, crystal defects (EOR (End-Of-Range) defects) in the source diffusion layers 211 and 212 and the drain diffusion layers 213 and 214 can be reduced. As the implantation energy of the neutral component 12N is higher in the second mode, the interstitial silicon Si_int2 is more widely scattered and its density is decreased accordingly. With this decrease, crystal defects in the source diffusion layers 211 and 212 and the drain diffusion layers 213 and 214 can further be reduced.

After carrying out the first and second modes, the ion implantation device 1 performs the annealing treatment. Due to this annealing treatment, the concentrations of the vacancy V1, the vacancy V2, the interstitial silicon Si_int1, and the interstitial silicon Si_int2 decrease in the manner as described above, and then the boron B1 and the boron B2 form the source diffusion layers 211 and 212 and the drain diffusion layers 213 and 214 as illustrated in FIG. 10. At this time, the concentrations of the vacancy V1, the vacancy V2, the interstitial silicon Si_int1, and the interstitial silicon Si_int2 decrease, and then the boron B1 and the boron B2 form the source diffusion layers 211 and 212 and the drain diffusion layers 213 and 214.

In this manner, the ion implantation device 1 and the ion implantation method according to the present embodiment can form source diffusion layers (or drain diffusion layers) formed of a plurality of impurity layers 211 and 212 (or a plurality of impurity layers 213 and 214) with fewer crystal defects in a short, single-sequence ion implantation process. The drain diffusion layers formed of the impurity layers 213 and 214 with fewer crystal defects can moderate the electric field in the vicinity of the drain, and thus can prevent or reduce generation of a leak current and hot carriers.

The ion implantation device 1 and the ion implantation method can also form diffusion layers having a plurality of concentration profiles in a single-sequence impurity implantation process. Thus, the present embodiment can improve the throughput and reduce the production costs.

It is possible to control the concentrations of the ion component 12I and the neutral component 12N of the ion beam 12 by adjusting the pressure in the chamber 3. Therefore, the controller 100 may control the concentrations of the ion component 12I and the neutral component 12N by adjusting the pressure in the chamber 3. For example, as the pressure in the chamber 3 is increased by 10 fold to $1\times10^{-3}$ (Pa) to $1\times10^{-2}$ (Pa), the ion beam 12 has an increased probability of colliding with the increased amount of particles accordingly. This increases the amount of the neutral component 12N by 10 fold. Thus, in the present embodiment, the concentration profiles of the diffusion layers can be formed precisely by controlling the concentration of the neutral component 12N.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a stage on which a wafer can be placed;
a separator configured to separate a beam of impurities to be introduced into the wafer into an ion component and a neutral component;
a controller configured to switch the semiconductor manufacturing apparatus between a first mode and a second mode, where the ion component being introduced into the wafer in the first mode and the neutral component being introduced into the wafer in the second mode; and
drivers configured to move the stage to a first location at which the ion component is introduced, and to a second location at which the neutral component is introduced.

2. The apparatus of claim 1, wherein the drivers adjust an inclination of the stage such that the ion component is introduced from a direction inclined at a first angle from a direction perpendicular to a surface of the wafer, and adjust an inclination of the stage such that the neutral component is introduced from a direction inclined at a second angle from a direction perpendicular to the surface of the wafer.

3. The apparatus of claim 2, wherein the controller causes the stage to move between the first location and the second location in synchronization with adjustment of the stage between the first angle and the second angle.

4. The apparatus of claim 1, further comprising a chamber in which the wafer can be accommodated, wherein
the controller controls concentrations of the ion component and the neutral component by using a pressure in the chamber.

5. The apparatus of claim 2, further comprising a chamber in which the wafer can be accommodated, wherein
the controller controls concentrations of the ion component and the neutral component by using a pressure in the chamber.

6. A semiconductor manufacturing apparatus comprising:
a stage on which a wafer can be placed;
a separator configured to separate a beam of impurities to be introduced into the wafer into an ion component and a neutral component; and
a controller configured to switch the semiconductor manufacturing apparatus between a first mode and a second mode, where the ion component being introduced into the wafer in the first mode and the neutral component being introduced into the wafer in the second mode, wherein
the separator causes a difference in energy between the ion component and the neutral component, introduces the ion component into the wafer by using first energy, and introduces the neutral component into the wafer by using second energy.

7. The apparatus of claim 1, wherein the separator causes a difference in energy between the ion component and the neutral component, introduces the ion component into the wafer by using first energy, and introduces the neutral component into the wafer by using second energy.

8. The apparatus of claim 2, wherein the separator causes a difference in energy between the ion component and the neutral component, introduces the ion component into the wafer by using first energy, and introduces the neutral component into the wafer by using second energy.

* * * * *